US012628439B2

(12) United States Patent (10) Patent No.: US 12,628,439 B2
Sakamoto (45) Date of Patent: May 12, 2026

(54) HEAT BLOCKING DEVICE, HEAT BLOCKING FILM, AND HEAT BLOCKING COMPOSITION

(71) Applicant: KYOTO UNIVERSITY, Kyoto (JP)

(72) Inventor: Masanori Sakamoto, Kyoto (JP)

(73) Assignee: KYOTO UNIVERSITY, Kyoto (JP)

( * ) Notice: Subject to any disclaimer, the term of this patent is extended or adjusted under 35 U.S.C. 154(b) by 506 days.

(21) Appl. No.: 18/247,224

(22) PCT Filed: Sep. 30, 2021

(86) PCT No.: PCT/JP2021/036231
§ 371 (c)(1),
(2) Date: Mar. 29, 2023

(87) PCT Pub. No.: WO2022/071511
PCT Pub. Date: Apr. 7, 2022

(65) Prior Publication Data
US 2023/0361235 A1 Nov. 9, 2023

(30) Foreign Application Priority Data
Sep. 30, 2020 (JP) ................................. 2020-166375

(51) Int. Cl.
*H10F 30/10* (2025.01)
*G02B 5/00* (2006.01)
(Continued)

(52) U.S. Cl.
CPC ............. *H10F 30/10* (2025.01); *G02B 5/008* (2013.01); *G02B 5/208* (2013.01); *H10F 77/162* (2025.01); *H10F 77/95* (2025.01)

(58) Field of Classification Search
CPC ....... G02B 5/008; G02B 5/208; G02B 5/003–206; H10F 30/10; H10F 77/162; C03C 2217/948; E04B 2001/7691
See application file for complete search history.

(56) References Cited

U.S. PATENT DOCUMENTS

2007/0292695 A1* 12/2007 Kodaira ................ C03C 17/007
427/160
2010/0208332 A1* 8/2010 Miyazaki ............... B82Y 20/00
359/315
(Continued)

FOREIGN PATENT DOCUMENTS

CN 106391055 A 2/2017
JP S556810 A 1/1980
(Continued)

OTHER PUBLICATIONS

International Search Report and Written Opinion issued for International Patent Application No. PCT/JP2021/036231, Date of mailing: Nov. 22, 2021, 8 pages including English translation of Search Report.
(Continued)

*Primary Examiner* — Jonathan Y Jung
(74) *Attorney, Agent, or Firm* — HSML P.C.

(57) ABSTRACT
The present disclosure is a heat blocking device 101 that includes a heat blocking film 10 including: a particle that absorbs an infrared ray and generates an electron and a hole; and an acceptor that receives the electron or the hole from the particle. A charge carrier selected from the electron and the hole is released from the heat blocking film 10 to an outside of the device. The heat blocking device 101 can function as a "heat removing" device. The heat blocking film 10 may be a single-layer film or a multilayer film.

8 Claims, 9 Drawing Sheets

(51) Int. Cl.
     G02B 5/20          (2006.01)
     H10F 77/00        (2025.01)
     H10F 77/162     (2025.01)

(56)                References Cited

U.S. PATENT DOCUMENTS

| | | | |
|---|---|---|---|
| 2014/0158202 A1* | 6/2014 | Sonoda | H01L 21/0254 |
| | | | 136/262 |
| 2018/0057655 A1 | 3/2018 | Kikuta et al. | |
| 2018/0282175 A1* | 10/2018 | Tsunematsu | C08K 3/2279 |
| 2019/0006541 A1* | 1/2019 | So | H10K 30/353 |
| 2020/0006582 A1* | 1/2020 | Sakamoto | H01L 21/02568 |

FOREIGN PATENT DOCUMENTS

| | | | |
|---|---|---|---|
| JP | S5553465 A | 4/1980 | |
| JP | H07315889 A | 12/1995 | |
| JP | 2000151247 A | 5/2000 | |
| JP | 2001313513 A | 11/2001 | |
| JP | 2002155215 A | 5/2002 | |
| JP | 2006010759 A | 1/2006 | |
| JP | 2011012112 A | 1/2011 | |
| JP | 2011181636 A | 9/2011 | |
| WO | 2016185951 A1 | 11/2016 | |

OTHER PUBLICATIONS

Extended European Search Report issued for European Patent Application No. 21875807.6, dated Mar. 28, 2025, 12 pages.

\* cited by examiner

HEAT BLOCKING DEVICE, HEAT BLOCKING FILM, AND HEAT BLOCKING COMPOSITION

TECHNICAL FIELD

The present invention relates to a heat blocking device in which a particle that absorbs an infrared ray is used, a heat blocking film, and a heat blocking composition.

BACKGROUND ART

It has been proposed to use, for the purpose of blocking heat, a particle that absorbs an infrared ray (the particle may be referred to as "infrared-absorbing particle" hereinafter). For example, Patent Literature 1 discloses a heat blocking composition including an indium tin oxide (ITO) particle and a transparent resin. Patent Literature 2 discloses a heat blocking composition including an infrared-absorbing particle, a silica particle, and a polymer emulsion particle. Patent Literature 2 also discloses, in addition to ITO, materials such as an antimony tin oxide (ATO) and zinc oxide as a material constituting the infrared-absorbing particle. Heat blocking compositions including an infrared-absorbing particle are suitable for inhibiting the amount of heat flowing in while allowing a part of incident light to permeate therethrough. Heat blocking compositions are applied onto a substrate, such as a glass plate and a resin film, to make a heat blocking film and then used as a heat blocking device together with the substrate.

CITATION LIST

Patent Literature

Patent Literature 1: WO 2016/185951
Patent Literature 2: JP 2011-181636 A

SUMMARY OF INVENTION

Technical Problem

Heat blocking compositions and heat blocking materials including an infrared-absorbing particle have been improved aiming mainly at enhancing transmittance in a predetermined wavelength region, particularly a visible region, while inhibiting an infrared ray flowing in. Attempts to improve compositions are also made in Patent Literatures 1 and 2 basically from the same viewpoint, that is, from the viewpoint of improving wavelength selectivity.

The present invention is intended to improve, from a new perspective, a heat blocking device including an infrared-absorbing particle. The present invention is also intended to provide a heat blocking film and a heat blocking composition suitable for this heat blocking device.

Solution to Problem

In conventional heat blocking devices including an infrared-absorbing particle, a part of energy absorbed by the particle flows, by heat transfer such as radiation, to a side, such as an indoor side, on which the incidence of an infrared ray should be restricted.

Based on a new concept of inhibiting the energy absorbed by the infrared-absorbing particle from being released as heat also to the side on which the incidence of an infrared ray should be restricted, the present inventor conducted intensive studies and have completed the present invention.

The present invention provides a heat blocking device that blocks at least a part of an infrared ray with which the heat blocking device is irradiated, including a heat blocking film including: a particle that absorbs the infrared ray and generates an electron and a hole; and an acceptor that receives the electron or the hole from the particle, wherein at least a part of charge carriers selected from the electron and the hole are released from the heat blocking film to an outside of the heat blocking device.

Also, the present invention provides a heat blocking film that blocks at least a part of an infrared ray with which the heat blocking film is irradiated, including:

a particle that absorbs the infrared ray and generates an electron and a hole; and an acceptor that can receive the electron or the hole from the particle, wherein i) the heat blocking film is provided with a charge generating layer including the particle and a charge receiving layer including the acceptor, and the charge generating layer and the charge receiving layer are in contact with each other, or ii) the heat blocking film is a single-layer film including the particle and the acceptor.

The present invention further provides a heat blocking composition for forming a heat blocking film, including:

a particle that absorbs an infrared ray and generates an electron and a hole; and an acceptor that can receive the electron or the hole from the particle, wherein iii) the heat blocking composition has a first composition including the particle and a second composition including the acceptor, or iv) the heat blocking composition is a composition including the particle and the acceptor.

Advantageous Effects of Invention

The present invention provides a new device suitable for inhibiting the energy absorbed by an infrared-absorbing particle from being released as heat. In the present invention, at least a part of charge carriers generated by infrared ray absorption move to acceptors and further are released to an outside of the device, so that recombination of the charge carriers is inhibited. As a result, release of thermal energy is inhibited. The present invention provides a film and a composition suitable for producing this device.

DESCRIPTION OF EMBODIMENTS

Figure 1A:
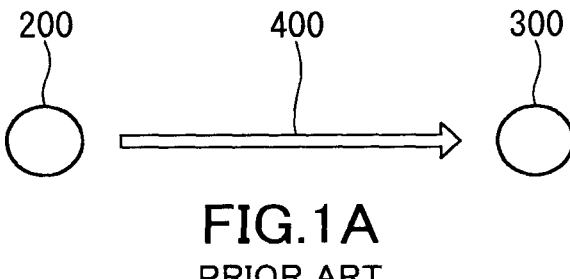
FIG. 1A is a schematic view for explaining temperature rise of a heat absorber caused by an infrared ray in the case where no heat blocking device is used.

The term "infrared ray" herein means an electromagnetic wave with a wavelength of 0.7 to 1000 μm. The term "semiconductor" as used herein includes not only common semiconductors but also semimetals and degenerate semiconductors. Semimetals are materials having a band structure in which the bottom of the conduction band and the top of the valence band slightly overlap each other over the Fermi level due to a distortion of the crystal structure, an interaction between layers of crystals, or the like. The term "degenerate semiconductor" refers to a substance in which the Fermi level is in a conduction band or a valence band by doping to a semiconductor. The term "nanoparticle" means a particle having a smallest diameter of less than 1 μm, which is, for example, 0.1 nm or more and less than 1 μm. The term "nanoparticle" typically means a particle having a largest dimension of 5 μm or less, or even 3 nm to 2 μm. The "smallest diameter" of a particle is defined by the smallest dimension through the center of gravity of the particle, while the "largest dimension" of a particle is defined by the longest line segment that can be set in the particle. The term "functional group" as used herein includes a halogen atom too. The term "charge carrier" refers to an electron and/or a hole. The term "principal surface" of a film refers to a film surface extending in a direction orthogonal to a thickness direction of the film.

In photoelectric conversion devices, at least a part of charge carriers generated in a photoelectric conversion portion are supplied to a conductive portion constituting, together with the device, a circuit including at least one of an inverter, an electricity storage device, a voltmeter, and an ammeter. In contrast, in the present invention, an outside to which at least a part of charge carriers generated in the film are released may not be a conductive portion constituting the above-mentioned circuit together with the heat blocking device of the present invention. The outside to which a part of the charge carriers are released may be other than a circuit including at least one of an inverter, an electricity storage device, a voltmeter, and an ammeter. In one embodiment of the present invention, the heat blocking device is connected to a conductive portion that is other than a circuit including at least one of an inverter, an electricity storage device, a voltmeter, and an ammeter, and releases at least a part of the charge carriers to the conductive portion.

The outside to which the charge carriers are released is not limited to a solid. The outside may include a gas or a liquid. A heat blocking film has a principal surface exposed to a gas or a liquid. In contrast, both principal surfaces of a photoelectric conversion film that serves the function of generating power in the photoelectric conversion devices are in contact with a layer that serves the function of transporting the charge carriers.

One embodiment of releasing the charge carriers to the outside of the device is conduction to the outside, but it is not limit to this. At least a part of the charge carriers can be released by oxidizing or reducing, on a surface of the device, a chemical species in the outside of the device. In other words, the process of releasing the charge carriers may be a process in which the amount of the charge carriers decreases in response to the oxidization or reduction of the chemical species in the outside of the device. This reaction typically proceeds on an interface between the heat blocking device and the outside, such as an exposed principal surface of the heat blocking film.

The charge carriers can be released only by conduction, only by a reaction that is oxidation or reduction, or by combination of the conduction and the reaction. In one embodiment of the present invention, the outside to which the charge carriers are released includes a first outside that is a gas or a liquid and a second outside that is a solid. At least a part of either one selected from the electron and the hole is released by oxidizing or reducing a chemical species in the first outside. At least a part of the other one selected from the electron and the hole is released by conduction to the second outside.

The outside mentioned above may be a solid conductive portion that can have a ground (GND) potential. The ground potential may be the earth potential. The outside may be a circuit that converts the energy of the released charge carriers only into Joule heat. The circuit does not need to include an active element such as a transistor. The circuit may only have a resistor as a passive element. The resistor may be a resistive element designed to have a predetermined resistance value, or may be a resistive body other than that. The resistive body may be a member designed for a purpose other than providing electrical resistance. This kind of member is a member designed, for example, to support the device. The circuit mentioned above may only have the resistive element as an element other than a switching element.

At least a part of the charge carriers released from the film are released to the outside having, for example, a ground potential, particularly the earth potential. Also, the energy of the charge carriers is converted only into Joule heat in the resistor, for example.

The heat blocking device may further include a conductive portion for releasing the charge carriers to the outside. The conductive portion inside of the device may include, for example, at least one selected from a conductive wire and a connection terminal for connecting the heat blocking device to the conductive portion in the outside. The conductive portion included in the heat blocking device may be electrically connected to the outside that is other than the circuit including at least one of an inverter, an electricity storage device, a voltmeter, and an ammeter.

The conductive portion may have a switching element. The switching element may be a manually-operated element or an element configured to be able to be controlled by an input signal from the outside. The switching element may be an element that controls electrical connection between the heat blocking device and the outside of the device. By controlling the conduction of the charge carriers, for example, the switching element can start and stop the release of the charge carriers from the heat blocking device and adjust the amount of the charge carriers to be released from the heat blocking device. By the adjustment of the amount of the charge carriers to be released from the heat blocking device, it is also possible, through controlling recombination of the charge carriers, to control the infrared ray to be re-emitted from the heat blocking device.

The heat blocking device may be connected to the conductive portion, or may include an electrode for connecting the heat blocking device to the conductive portion in the outside. The electrode may be a light-transmissive electrode called a transparent electrode, or may be a non-light-transmissive electrode such as a metal electrode.

The heat blocking device may further include a non-light-transmissive electrode. A region in which the non-light-transmissive electrode is formed may be less than 50% of a light receiving region from which the infrared ray enters the device. This ratio may be 1% or more and less than 50%, or even 5% or more and less than 50%.

In the heat blocking device, the conductive portion may include an electrode that receives the charge carriers from the heat blocking film. In addition, the conductive portion may include a first electrode and a second electrode disposed in such a manner as to sandwich the heat blocking film therebetween. The first and second electrodes may be a combination of a light-transmissive electrode and a non-light-transmissive electrode, a combination of light-transmissive electrodes, or a combination of non-light-transmissive electrodes. However, the conductive portion may include only the first electrode or the second electrode, that is, only one or a plurality of electrodes formed in such a manner as to be in contact with only one of the film surfaces of the blocking film.

The heat blocking device may further include a resistive element. In the resistive element, at least a part of the energy of the charge carriers released from the film is converted into Joule heat. For example, the conductive portion of the heat blocking device may include a resistive element designed to have a predetermined resistance value. Also in this case, the charge carriers can be released to the outside of the device via the resistive element in the device.

In the heat blocking device, the heat blocking film may have a light transmittance of 24% or more, 25% or more, or even 30% or more, and in some cases 40% or more at a wavelength of 700 nm. The heat blocking film may have a light transmittance of 18% or more, 20% or more, or even 30% or more, and in some cases 40% or more at a wavelength of 600 nm.

In the heat blocking device, 50% or more of the light receiving region from which the infrared ray enters the device may be a light-transmissive region. At least a part of visible light passes through the light-transmissive region. The ratio of the light-transmissive region may be 50% or more, even 70% or more, or particularly 95% or more. In the light-transmissive region, at least a part of visible light entering with the infrared ray passes through. The heat blocking film may be disposed in the light-transmissive region. In a non-light-transmissive region other than the light-transmissive region, a metal member such as a connection terminal, a non-light-transmissive electrode and the like may be disposed.

In the heat blocking device, the heat blocking film may have: a charge generating layer including a particle that absorbs an infrared ray and generates an electron and a hole; and a charge receiving layer including an acceptor. The charge generating layer and the charge receiving layer may be in contact with each other. In the heat blocking device according to the present invention, the heat blocking film may be a single-layer film including the particle and the acceptor mentioned above. The heat blocking film may be formed on a substrate directly or via another film. One example of such film is an electrode, especially a transparent electrode.

The heat blocking device may further include an adhesive layer for fixing the heat blocking device. The heat blocking device may further include a first light-transmissive substrate and a second light-transmissive substrate disposed apart from each other. The heat blocking film may be disposed on a surface, on the second light-transmissive substrate side, of the first light-transmissive substrate and/or a surface, on the first light-transmissive substrate side, of the second light-transmissive substrate.

The particle that absorbs an infrared ray and generates an electron and a hole may include a material that can absorb an infrared ray by localized surface plasmon resonance. The particle may be an inorganic particle.

Hereinafter, embodiments of the present invention will be further described with reference to the drawings as needed. The following description is not intended to limit the present invention to specific embodiments. Members and components shown in one figure and being common to another figure are denoted by the same reference numerals in the FIGURES and will not be described repeatedly. Descriptions made with reference to one figure are also applicable to embodiments shown in the other FIGS. unless apparent inconsistency occurs.

[Heat Blocking by Device]

Figure 1B:
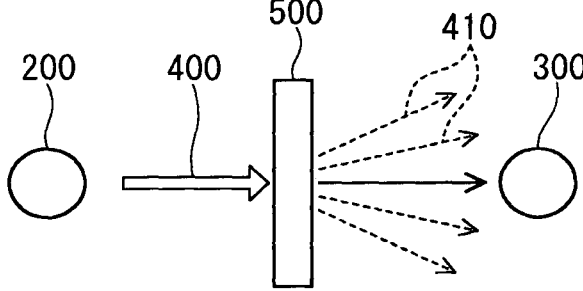
FIG. 1B is a schematic view for explaining a mechanism of heat blocking by a conventional device.

As shown in FIG. 1A, an infrared ray 400 emitted from a heat source 200 reaches a heat absorber 300 and causes a temperature rise $\Delta T_O$ of the heat absorber 300. In FIG. 1B, a heat blocking device 500 having an infrared-absorbing property is disposed between the heat source 200 and the heat absorber 300. The heat blocking device 500 allows a part of the infrared ray 400 to transmit therethrough and absorbs a part thereof. The heat blocking device 500 can inhibit a temperature rise OTA of the heat absorber 300 to some extent ($\Delta T_A < \Delta T_O$). However, the infrared ray 400 absorbed by the heat blocking device 500 is re-emitted as an infrared ray 410 from the heat blocking device 500 by radiation and a part thereof reach the heat absorber 300. Although the infrared ray is re-emitted from the heat blocking device 500 also in directions toward the heat source 200, the infrared ray toward the heat source 200 is omitted in FIG. 1B. This is also the case with FIGS. 1C and 1D.

Figure 1C:
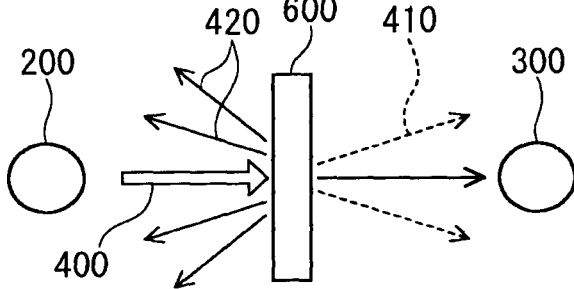
FIG. 1C is a schematic view for explaining a mechanism of heat blocking by another conventional device.

In FIG. 1C, a heat blocking device 600 that is obtained by enhancing the infrared-reflecting property of the device 500 is disposed instead of the heat device 500. In this case, a temperature rise $\Delta T_R$ of the absorber 600 can be even more inhibited ($\Delta T_R < \Delta T_A$). However, an infrared ray 420 reflected by the heat blocking device 600 hinder a temperature decrease of the heat source 200 or that in a highly-closed space accommodating the heat source 200 in some cases. The heat source 200 placed in a highly-closed space in some cases is an artificial heat source typified by an industrial reactor. Even in a poorly-closed space, the strong, reflected infrared ray 420 can cause a negative impact to the surrounding environment. An example of the infrared ray 420 as stated herein is sunlight that is reflected by an outer wall of a building and reaches a neighboring building.

Figure 1D:
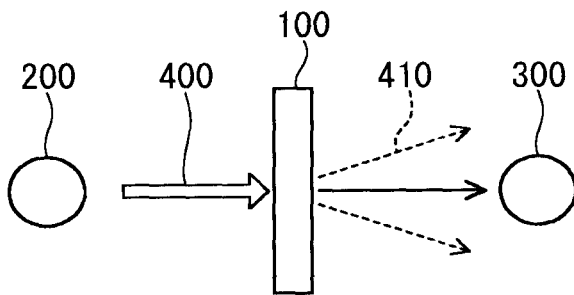
FIG. 1D is a schematic view for explaining a mechanism of heat blocking by a device of the present invention.

A heat blocking device 100 of the present embodiment shown in FIG. 1D releases a part of energy of the absorbed infrared ray to an outside as charge carriers. Therefore, a temperature rise of the heat absorber 300 by the re-emitted infrared ray 410 is inhibited ($\Delta T_f < \Delta T_A$). The use of the heat blocking device 100 inhibits the re-emission of the infrared ray without depending on an increase of the infrared ray reflected by the device 100. At least a part of the charge carriers generated by absorbing a part of energy of the infrared ray 400 are released by, for example, conduction to a conductive portion in the outside. Unlike the release of energy by reflected light, the release of energy as charge carriers can be controlled easily in terms of release destination. As described above, it is possible to release the charge carriers by, for example, allowing them to be involved in a chemical reaction on a surface of the heat blocking device 100.

[Configuration of Device]

Figure 2A:
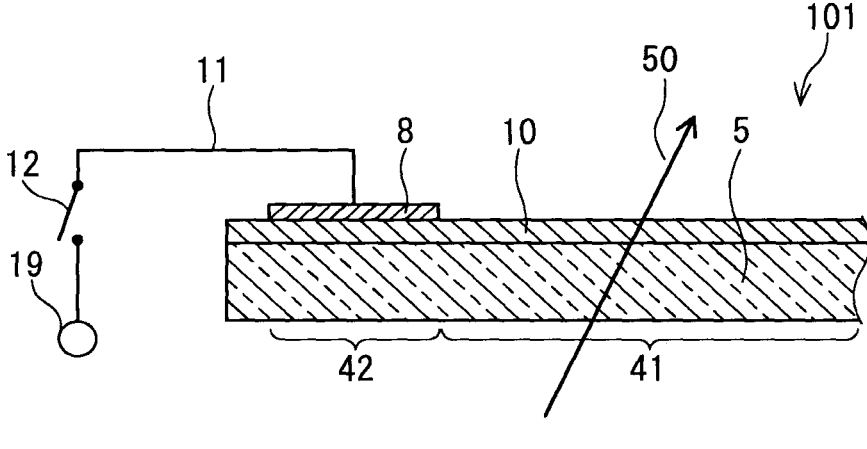
FIG. 2A a diagram showing a cross section of one embodiment of the device of the present invention together with a simplified view of a conductive portion.

In the embodiment shown in FIG. 2A, a heat blocking device 101 includes a substrate 5 and a heat blocking film 10 formed on the substrate 5. One of the principal surfaces of the heat blocking film 10 is an exposed surface and is in contact with a gas in the outside. The heat blocking film 10 includes an infrared-absorbing particle that absorbs an infrared ray and generates an electron and a hole, and an acceptor that can receive from the infrared-absorbing particle a charge carrier, which is the electron or the hole. The heat blocking device 101 includes an electrode 8 disposed in such a manner as to be in contact with a part of the heat blocking film 10. The electrode 8 is formed on a peripheral portion of a surface of the heat blocking film 10. The electrode 8 is a metal film, for example, and is substantially non-light-transmissive, but it may be a light-transmissive film. One end of a conductive portion 11 is connected to the electrode 8. The other end of the conductive portion 11 is connected to a release destination 19 to which the charge carriers are released. The release destination 19 is a charge receiving portion that is present in the outside of the device. The conductive portion 11 has a switching element 12 between the electrode 8 and the release destination 19.

Figure 2B:
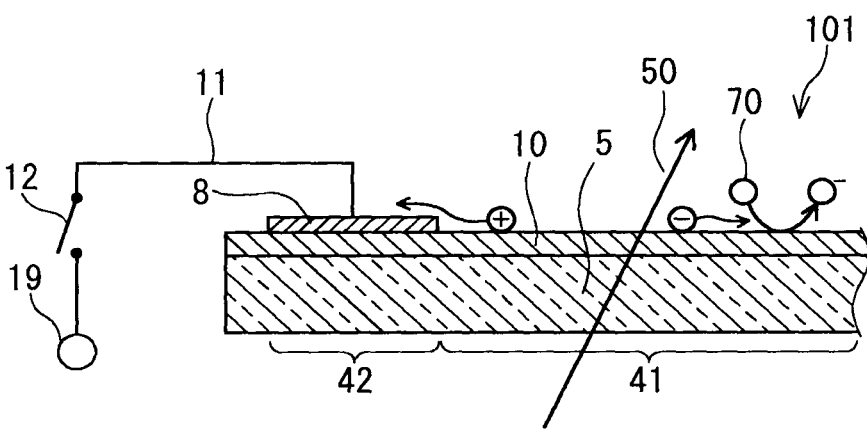
FIG. 2B is a diagram for explaining an example of release of charge carriers in the case of the device shown in FIG. 2A.

An example of the release of the charge carriers in the embodiment of FIG. 2A will be explained with reference to FIG. 2B. In this example, the electron generated in the heat blocking film 10 reduces a chemical species 70 in the outside on the principal surface of the heat blocking film 10 and consequently is released from the heat blocking device 101. In this example, the heat blocking film 10 functions as a photocatalyst and accelerates the reaction of the chemical species 70. In contrast, the hole passes through the electrode

8 and the conductive portion 11 and is led out to the release destination 19. Note that the release of the charge carriers shown in FIG. 2B is only one example of various embodiments of the release. The release of the charge carriers may proceed by a chemical reaction occurring with the oxidation and reduction of the chemical species in the outside by the charge carriers, the leading-out of the charge carriers to the outside, or a combination of these. The reaction, such as oxidation of the chemical species in the outside, may be a reaction that occurs with decomposition and/or modification of the chemical species.

The release destination 19 may be a ground, particularly the earth, The ground may be other than the earth as long as it can provide a predetermined potential. The predetermined potential may be a ground potential or the earth potential. The release destination 19 may be a frame of a window or a body of a car, for example. They can sufficiently function as a ground even in the case where they are not earthed. In response to opening/closing of the switching element 12, the electrode 8 is, for example, disconnected from or connected to the release destination 19 that is a ground. The switching element 12 may be a manually-operated device or a device that is controlled to open and close by a switching control portion (a controller) not shown in the FIGURES. Note that the switching element 12 is optional. In the case where the switching element 12 is omitted, the electrode 8 is connected directly to the release destination 19 via the conductive portion 11 and the potential of the conductive portion 11 is fixed to the earth potential, for example.

The conductive portion 11 is a conductive wire, for example, but is not limited to this and may be a conductive adhesive, a solder, a conductive member, etc., or may be composed of a plurality of these. The conductive adhesive and the solder are used, for example, to fix the conductive wire to the electrode. The conductive member may be, for example, a connection terminal that connects the conductive wire to the electrode, or a member for fixing the entire device. The connection terminal that connects the conductive wire to the electrode may be, for example, a known terminal for supplying electric power to an antenna wire of glass for a vehicle. Such a connection terminal is disclosed in JP 2001-313513 A, JP 2000-151247 A, etc. The connection terminal makes it possible, for example, to be electrically connected to the heat blocking device 101 only by physically pushing the conductive wire into the connection terminal. An example of the member for fixing the entire device may be a member that supports a peripheral portion of the device in order to set the device in a window frame.

The conductive portion 11 may be provided in the heat blocking device 101 in advance, or may be provided in the outside of the heat blocking device 101. A conductive portion provided in the heat blocking device 101 in advance may be connected to another conductive portion provided in the outside to constitute the entire conductive portion 11.

The heat blocking device 101 has a light receiving region that can receive an incident light 50 including an infrared ray. A light source of the incident light 50 may be the sun or an artificial light source. Examples of the artificial light source include a high-temperature heat source such as a high-temperature furnace. The light receiving region includes a light-transmissive region 41 through which at least a part of a visible light included in the incident light 50 passes through, and a non-light-transmissive region 42 through which the visible light included in the incident light 50 does not substantially pass through. In the non-light-transmissive region 42 of the heat blocking device 101, the electrode 8 made of a metal blocks the transmittance of the incident light 50. The ratio of the light-transmissive region 41 in the entire light receiving region may be 50% or more, 70% or more, or even 90% or more. The light-transmissive region 41 has a visible light transmittance of, for example, 20% or more, or even 30% or more.

In the heat blocking device 101, the light-transmissive region 41 is present because of the light-transmissive substrate 5. In the case where the substrate 5 is non-light-transmissive, the light receiving region is entirely the non-light-transmissive region 42. In this case, the device 101 is disposed in such a manner that the heat blocking film 10 is positioned closer to the incident side of the incident light than the substrate 5 is. Also in this case, however, it is desirable that the non-light-transmissive electrode 8 disposed on the light incident side is formed in a limited area of the light receiving region, specifically, in a region of less than 50%, less than 30%, or even less than 10% of the light receiving region. The region in which the non-light-transmissive electrode 8 is formed may be 1% or more, 3% or more, or even 5% or more of the light receiving region.

Figure 3:
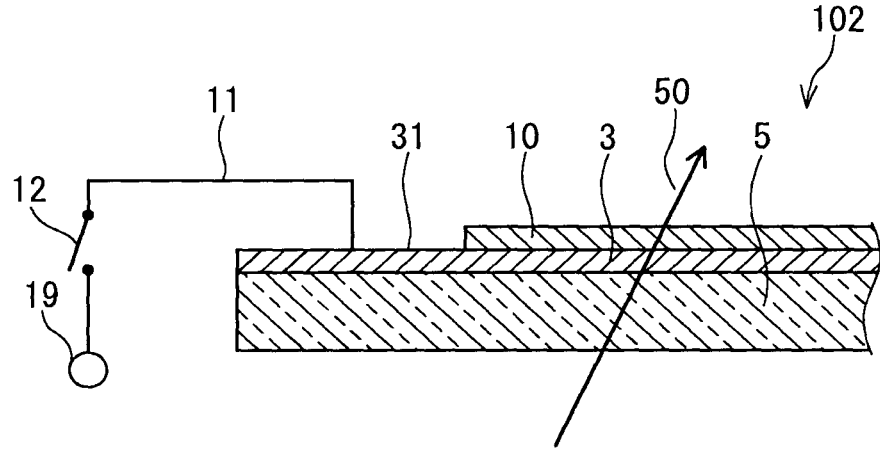
FIG. 3 is a diagram showing a cross section of another embodiment of the device of the present invention together with a simplified view of the conductive portion.
Figure 4:
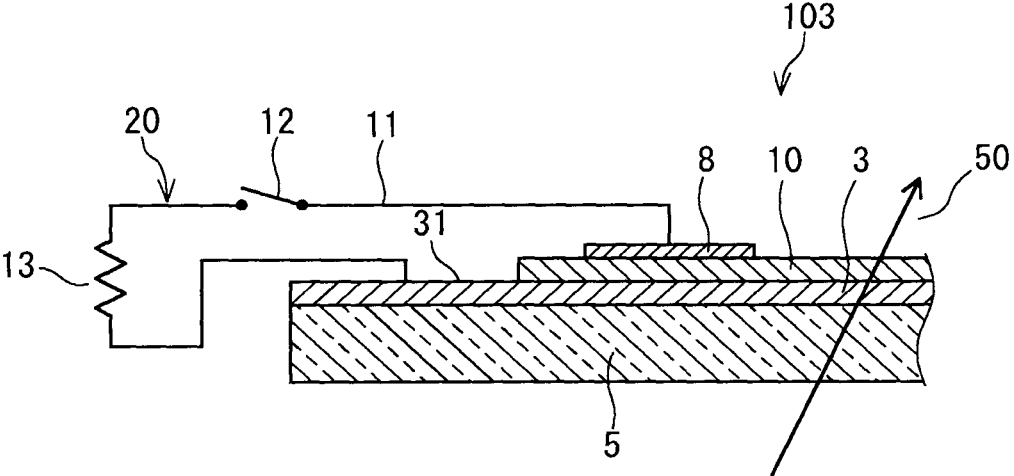
FIG. 4 is a diagram showing a cross section of still another embodiment of the device of the present invention together with a simplified view of a conductive portion.

As shown in FIG. 3 and FIG. 4, heat blocking devices 102 and 103 may include a transparent electrode 3 instead of or together with the electrode 8. In the heat blocking device 102 shown in FIG. 3, the transparent electrode 3 is formed between the heat blocking film 10 and the light-transmissive substrate 5. A part of a surface of the transparent electrode 3 is an exposed region 31 that is not covered with the heat blocking film 10. The exposed region 31 is used as a region for connection to the conductive portion 11. The connection between the transparent electrode 3 and the conductive portion 11 may be made in the same manner as the connection between the electrode 8 and the conductive portion 11.

The heat blocking devices 101 and 102 each are connected to the release destination 19 via the switching element 12. In contrast, the heat blocking device 103 constitutes a part of a circuit 20 having a resistor 13. From another aspect, a conductive portion constituting a part of the circuit 20 is present in an outside of the heat blocking device 103. The resistor 13 may be a passive element designed to show a predetermined resistance value, or may be a resistive body that is not designed as a passive device. In the case where the resistor 13 is present in the outside of the device, the two conductive portions 11 of the heat blocking device 103 are connected respectively to ends of the resistor 13 to constitute the circuit 20.

As shown in the figure, neither an inverter nor an electricity storage device may be connected to the circuit 20. No measuring apparatuses that function as an ammeter and/or a voltmeter may be connected to the circuit 20. No power source may be included in the circuit 20, either. This is also the case with the conductive portion 11. In other words, the charge carriers are released to the release destination 19 or converted into thermal energy in the resistor 13 without passing through any of an inverter, an electricity storage device, an ammeter, and a voltmeter.

In the heat blocking devices 101, 102, and 103, the heat blocking film 10 has a principal surface exposed to the outside. As for the exposed principal surface, 50% or more, or even 70% or more of its area may be exposed to the outside. The outside with which the exposed principal surface is in contact may be a gaseous phase or a liquid phase.

In the heat blocking devices 101 and 102, the charge carriers generated in the heat blocking film 10 can be released to the outside by being involved in the chemical reaction, or can be released to the release destination 19 in the outside via the electrode 3 or 8 and the conductive portion 11. This release significantly decreases the amounts of the electrons and the holes to be recombined in the device. The inhibition of the recombination leads to inhibition of the amount of heat to be re-emitted from the device, in other words, inhibition of a temperature rise of the device. Note that in the heat blocking device 103, the charge generated in the heat blocking film 10 is recombined in the resistor 13 in the outside of the device and generates Joule heat. Also in this case, however, the amounts of the electrons and the holes to be recombined in the device are significantly reduced, inhibiting the amount of the heat to be released from the device 103.

Accordingly, the heat re-emitted as an infrared ray is more inhibited in the heat blocking devices 101, 102, and 103 than in conventional heat blocking films that absorb infrared ray as received. For example, use of the heat blocking devices for construction materials inhibits buildings, roads, etc., from being heated, making it possible to contribute to reducing a so-called heat island phenomenon. The heat blocking devices can also be used to inhibit electronic devices, such as an LED display, that release an infrared ray from being heated and light sources, such as a headlight, that release an infrared ray from being heated. In these light emitting bodies, the heat blocking devices can also inhibit light-emitting efficiency from being reduced. The heat blocking devices may further include a source of light including light in an infrared region.

For explaining the aspects of the release of the charge, the heat blocking devices 101, 102, and 103 are simplified in FIGS. 2A to 4, but they each may further include a member that is not shown in the FIGURES. For example, the heat blocking devices 101 and 102 may include two or more units of electrode 8 disposed apart from each other on the heat blocking film 10, or may be connected to two or more units of the release destination 19 via two or more sets of the conductive portion 11. This is also the case with the heat blocking device 103.

Figure 5:
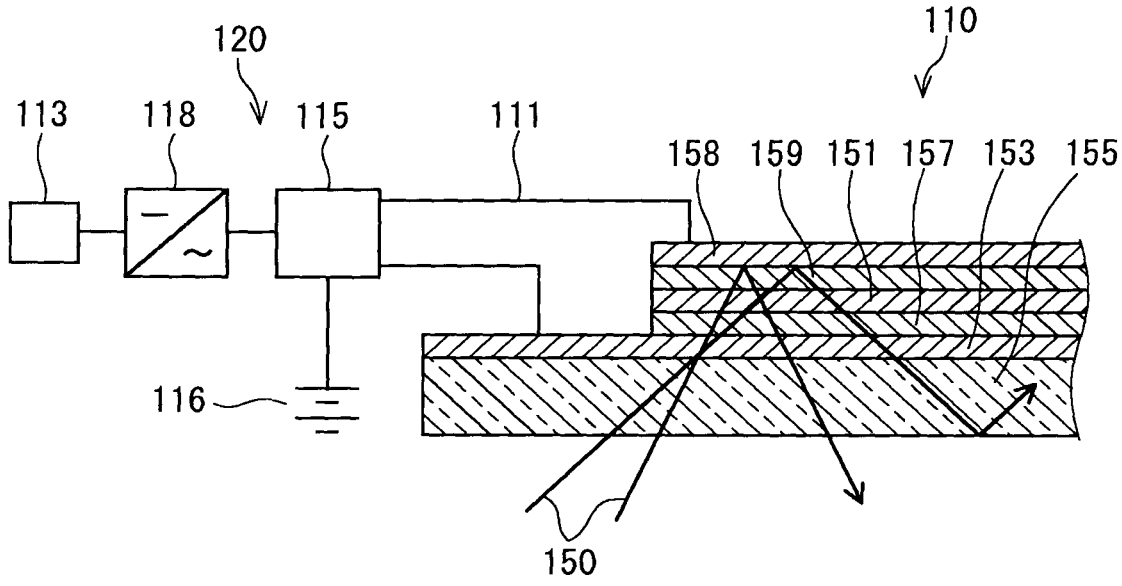
FIG. 5 is a diagram showing a cross section of a photo-electric conversion apparatus together with a circuit connected to the apparatus.

Here, a general photoelectric conversion apparatus will be explained with reference to FIG. 5. A charge-and-discharge controller 115, an inverter 118, and a load 113 are connected, via a conductive wire 111, to a circuit 120 connected to a photoelectric conversion apparatus 110. Further, a storage battery 116 is connected to the controller 115. In the circuit 120, wiring among the devices 113, 115, 116, and 118 is simplified and shown with single lines. When the load 113 is a DC load, the inverter 118 is unnecessary, but the storage battery 116 is disposed also in this case. In the case where the circuit 120 is connected to a utility grid to an electric power company, the storage battery 116 can be omitted, but a power conditioner having a function as an inverter is necessary between the photoelectric conversion apparatus 110 and the utility grid. Unlike in the circuit 20 mentioned above, at least one of an inverter and an electricity storage device is disposed in the circuit 120. Also in a laboratory, a measuring apparatus, such as a voltmeter, is connected to the photoelectric conversion apparatus in order to learn its properties. Unlike the heat blocking devices described above, the photoelectric conversion apparatus is connected to at least one of an inverter, an electricity storage device, a voltmeter, and an ammeter.

The photoelectric conversion apparatus 110 has a transparent electrode 153, an electron transport layer 157, a power generation layer 151, a hole transport layer 159, and a rear electrode 158 in this order on a light-transmissive substrate 155. The rear electrode 158 takes out electric current while serving as a reflecting layer to confine a part of an incident light 150 in the device. Therefore, unlike in the heat blocking devices 101, 102, and 103, it is usual in the photoelectric conversion apparatus 110 that the two electrodes 155 and 158 are formed on the substantially entire region of the photoelectric conversion apparatus 110 in order to improve photoelectric conversion efficiency, and a light-transmissive region is not present or is present in a very limited area even if it is. Moreover, unlike the heat blocking devices (see FIGS. 2A and 3) that may include only the electrode 3 or 8 that is a single layer, the photoelectric conversion apparatus 110 requires the electrodes 153 and 158 that, as a plurality of layers separated, sandwich the power generation layer 151 therebetween.

In the photoelectric conversion apparatus 110, two principal surfaces of the power generation layer 151 are entirely covered with the adjacent layers 157 and 159 and are not exposed to the outside.

As described above, it is understood that the heat blocking devices 101, 102, and 103 each have the heat blocking film 10 that is an infrared-absorbing film and may be connected to the outside of the device in such a manner that at least one selected from the group consisting of v) and vi) below holds.

From these embodiments, there can be learned a method for using an infrared-absorbing device, as a heat blocking device, that is provided with an infrared-absorbing film including: a particle that absorbs an infrared ray and generates an electron and a hole; and an acceptor that receives the electron or the hole from the particle, including disposing the infrared-absorbing device in such a manner that at least one selected from v) to vii) below holds:

v) at least a part of charge carriers selected from the electron and the hole generated in the infrared-absorbing film by irradiation with an infrared ray are released by oxidizing or reducing a chemical species in an outside of the infrared-absorbing device, the outside being in contact with a principal surface of the infrared-absorbing film and being a gaseous phase or a liquid phase;

vi) at least a part of the electrons and the holes generated in the infrared-absorbing film by irradiation with an infrared ray are recombined in an outside of the infrared-absorbing device, the outside being other than a circuit including at least one of an inverter, an electricity storage device, a voltmeter, and an ammeter;

vii) at least a part of charge carriers selected from the electron and the hole generated in the infrared-absorbing film by irradiation with an infrared ray are released to an outside of the infrared-absorbing device, the outside having a ground potential.

However, as described above, the device may include a resistive element. In this case, the electron and the hole are recombined not only in the outside of the device but also in the inside of the device to generate Joule heat. In vi), the outside of the device includes none of an inverter, an electricity storage device, a voltmeter, and an ammeter.

Referring back to FIGS. 2A, 2B, 3, and 4, a relationship between the opening/closing of the switching element 12 and the re-emission will be explained. Closing the switching element 12 significantly reduces the amounts of the electrons and the holes to be recombined in the devices 101, 102, and 103, inhibiting the amount of the heat to be re-emitted from the devices 101, 102, and 103. Opening the switching element 12 reduces the amount of the charge to be released to the outside and accordingly, the temperature of the heat blocking film 10 rises and the amount of the heat to be released from the heat blocking film 10 also increases. In the case where the heat blocking device is used as a window, there can be a situation in summer where the amount of heat entering from the outside of a room should be inhibited. In this situation, it is appropriate to close the switching element 102. In contrast, it is desirable not to allow heat to escape from the inside to the outside of a room in winter and so on. In this situation, it is appropriate to keep the switching element 102 open. The switching element 102 may be operated manually, or the opening/closing thereof may be automatically controlled by a controller. Data such as temperatures detected by temperature sensors in the inside and outside of the room and light intensity detected by a photosensor in the outside of the room can be input to the controller, for example.

Figure 6:
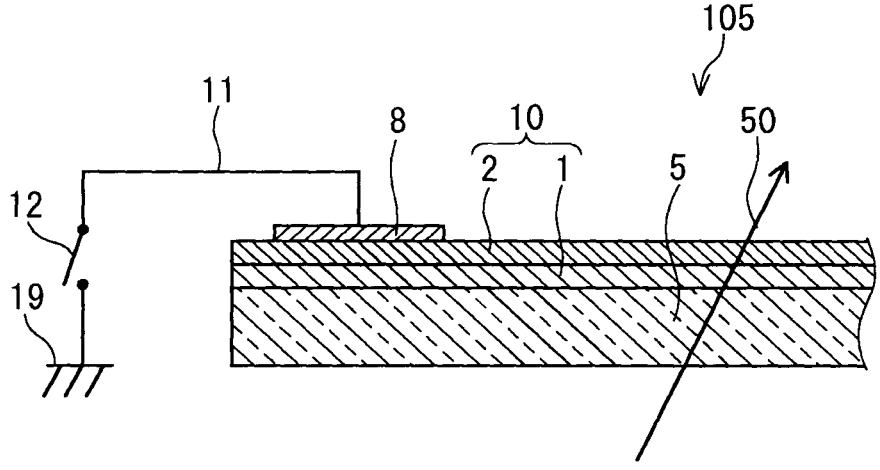
FIG. 6 is a diagram showing a cross section of still another embodiment of the device of the present invention together with a simplified view of the conductive portion.
Figure 7:
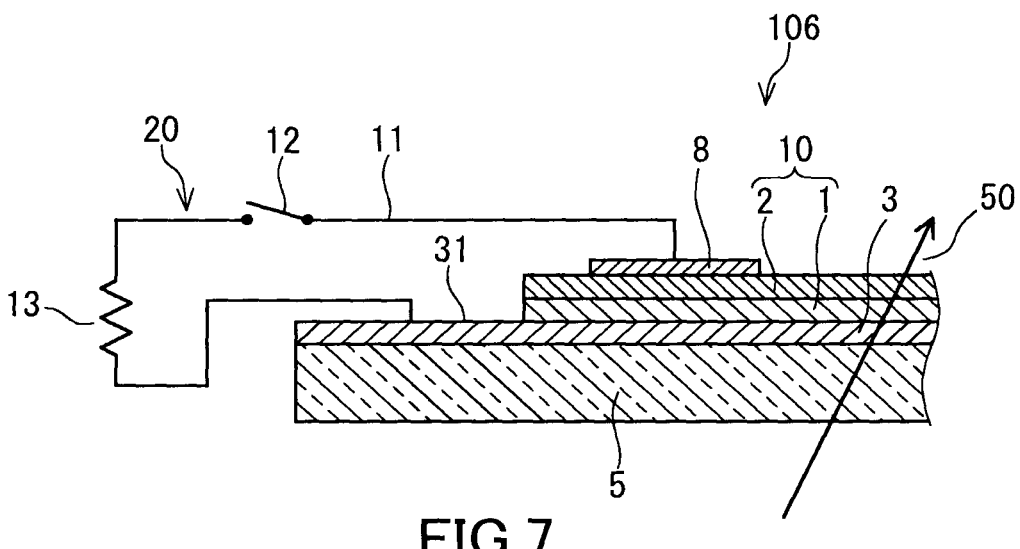
FIG. 7 is a diagram showing a cross section of still another embodiment of the device of the present invention together with a simplified view of the conductive portion.

The heat blocking film 10 may be a single-layer film or a multilayer film composed of a plurality of layers. FIGS. 6 and 7 each show an example of the heat blocking device including the heat blocking film that is multilayer. In the heat blocking devices 105 and 106, the heat blocking film 10 has a charge generating layer 1 and a charge receiving layer 2. The charge generating layer 1 includes a particle that absorbs an infrared ray and generates an electron and a hole. The charge receiving layer 2 includes an acceptor that can receive the electron or the hole from the particle. The positions of the charge generating layer 1 and the charge receiving layer 2 may be reversed to be different from those shown in the FIGURES. In the example shown in FIG. 6, the release destination 19 is a ground.

As shown in FIGS. 6 and 7, the heat blocking device may include only one charge receiving layer, or may include two or more charge receiving layers. In the latter case, a charge receiving layer that receives the electron may be disposed on one side and a charge receiving layer that receives the hole may be disposed on the other side of the charge generating layer sandwiched therebetween. Note that the heat blocking device can function sufficiently even in the case where it has only one charge receiving layer that receives the electron or the hole. Moreover, in FIG. 2A, the heat blocking device may have a configuration in which the electrode 8 is omitted and the conductive portion 11 is connected directly to the heat blocking film 10, which is not shown in the figure. Also, the heat blocking device may have an electron transport layer or a hole transport layer between the heat blocking film and the electrode. The electron transport layer or the hole transport layer is disposed, for example, between the charge receiving layer and the electrode that is a transparent electrode, a metal electrode, or the like.

[Heat Blocking Film]

Hereinafter, materials and layers that can constitute the heat blocking film will be explained.

(Infrared-Absorbing Particle)

The infrared-absorbing particle is not particularly limited as long as it is a particle that absorbs an infrared ray and generates an electron and a hole. The infrared-absorbing particle can generate a carrier having higher energy than that of a carrier at the Fermi level. An infrared-absorbing material that the infrared-absorbing particle can include is as follows.

The infrared-absorbing material may include at least one selected from the group consisting of an oxide, a phosphide, a sulfide, a selenide, and a telluride, or may include at least one selected from the group consisting of a sulfide, a selenide, and a telluride. For applications that require durability such as thermal resistance, for example, a material including an oxide is generally suitable. The infrared-absorbing material may be a semiconductor or may be doped. Examples of the doping include doping with different elements, self-doping, and defect doping.

It is desirable that the infrared-absorbing material is an inorganic material such as those mentioned above. Such an infrared-absorbing particle is suitable to be used in applications in which a lot of infrared rays are absorbed and the heat blocking film reaches a high temperature. The infrared-absorbing particle is not particularly limited as long as it is a particle that absorbs an infrared ray and generates an electron and a hole as mentioned above.

The infrared-absorbing material may include a transparent electrically conductive oxide. Examples of the transparent electrically conductive oxide include tin-doped indium oxide (ITO), aluminum-doped indium oxide, cerium-doped indium oxide, aluminum-doped zinc oxide, gallium-doped zinc oxide, indium-doped zinc oxide, indium-doped cadmium oxide, fluorine-indium-doped cadmium oxide, fluorine-doped cadmium oxide, chlorine-doped cadmium oxide, bromine-doped cadmium oxide, cesium-doped molybdenum oxide, antimony-doped tin oxide (ATO), fluorine-doped tin oxide (FTO), titanium oxide, gallium oxide, and vanadium oxide.

The infrared-absorbing material may include at least one selected from the group consisting of copper sulfide, copper phosphide, copper telluride, copper selenide, ruthenium oxide, rhenium oxide, molybdenum oxide, tungsten oxide, tungsten bronze, and delafossite copper oxide, or may include copper sulfide and/or tungsten oxide.

Examples of the copper sulfide include those represented by CuS and $Cu_{2-x}S$ ($0<x<1$). Examples of the copper phosphide include those represented by $Cu_{3-x}P$ ($0<x<1$) and CuP, examples of the copper telluride include those represented by CuTe and $Cu_{2-x}Te$ ($0<x<1$), and examples of the copper selenide include those represented by CuSe and $Cu_{2-x}Se$ ($0<x<1$).

Examples of the ruthenium oxide include those represented by $RuO_2$ and $RuO_{2-x}$ ($0<x<1$). Examples of the rhenium oxide include those represented by $ReO_2$ and $ReO_{2-x}$ ($0<x<1$), examples of the molybdenum oxide include those represented by $MoO_3$ and $MoO_{3-x}$ ($0<x<1$), and examples of the tungsten oxide include those represented by $WO_3$ and $WO_{3-x}$ ($0<x<1$).

The tungsten bronze is a non-stoichiometric compound formed of tungsten oxide and a metal atom, such as an alkali metal, having entered the tungsten oxide at a non-stoichiometric ratio. Specific examples of the tungsten bronze include $CsxWO_3$ ($0<x<1$; CWO), $LiWO_3$, $LiCsWO_3$, $LiRbWO_3$, and $LiKWO_3$. Examples of the delafossite copper oxide include $CuAlO_2$, $CuGaO_2$, and $CuCrO_2$.

The infrared-absorbing particle may include a material potentially absorbing an infrared ray by localized surface plasmon resonance (the material may be referred to as "LSPR-IR absorbing material" hereinafter). The presence of LSPR of the LSPR-IR absorbing material can be confirmed by, for example, a method for revealing that a change in absorption peak wavelength is linear, the change being obtained by changing the refractive index of an ambient medium. The LSPR-IR absorbing material may be a semiconductor. Note that the LSPR-IR material is not essential in the infrared-absorbing particle.

The LSPR-IR absorbing material may be a material whose relaxation time from localized surface plasmon excitation can be 1 ns or longer. The material having such a property is, for example, at least one selected from the group consisting of copper sulfide, copper selenide, and cesium tungsten oxide (CWO). However, the material having such a property is not limited to these materials, and an appropriate material can be selected by measuring the relaxation time from localized surface plasmon excitation by time-resolved transient absorption spectroscopy.

Figure 8:
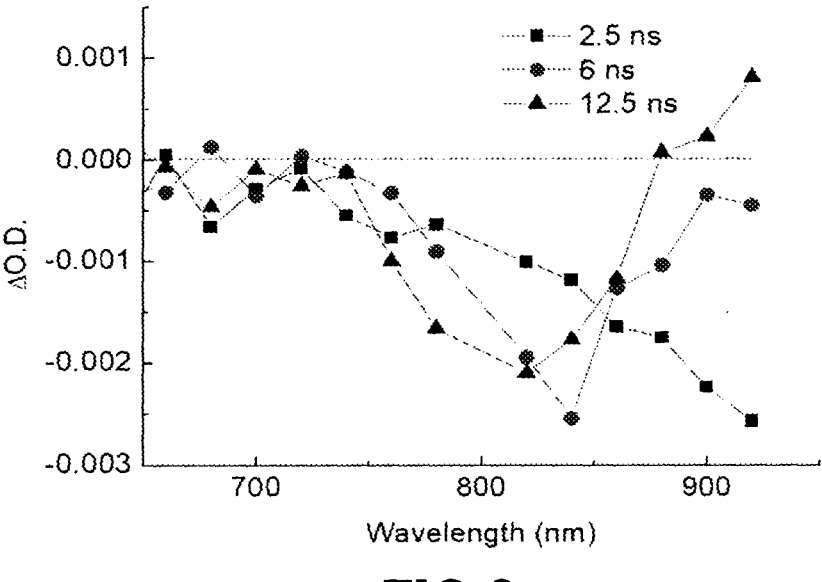
FIG. 8 shows an example of a result of measurement of the relaxation time from localized surface plasmon excitation.

FIG. 8 shows an example of a result of measurement of the relaxation time from localized surface plasmon excitation by time-resolved transient absorption spectroscopy. FIG. 8 shows an absorption spectrum obtained 2.5 nanoseconds (ns), 6 ns, and 12.5 ns after the localized surface plasmon excitation. In the absorption spectrum shown in FIG. 8, bleach (negative signal) by the localized surface plasmon excitation can be confirmed in a near-infrared region. In the example shown in FIG. 8, the negative signal remains 2.5 ns, 6 ns, and even 12.5 ns later, which means that the relaxation time is at least 10 ns or longer. A material that can exhibit such a long relaxation time of an active carrier after the excitation of LSPR regardless of the wavelength and intensity of a pump light is suitable as the LSPR-IR absorbing material. Note that the time-resolved transient absorption spectroscopy may be a direct method by which the entire duration of a phenomenon is directly measured.

FIG. 8 shows the measurement result for copper sulfide. This measurement was performed by a pump-probe method using a chloroform solution of copper sulfide as a specimen, a picosecond laser with a wavelength of 1064 nm as a pump light, and a supercontinuum light source as a probe light. The laser light and the probe light are specifically as follows.

Picosecond laser ("PL2210A" available from EKSPLA; repetition frequency: 1 kHz; pulse width: 25 ps; pulse energy: 0.9 mJ (wavelength: 1064 nm))

Supercontinuum light source ("SC450" available from Fianium Ltd.; repetition frequency: 20 MHz; pulse width: 50 to 100 ps)

However, these conditions are an example, and appropriate conditions for measurement of the relaxation time from localized surface plasmon excitation can be set according to the material to be measured.

(Acceptor)

The type of the acceptor is not particularly limited as long as it can receive an electron or a hole from the infrared-absorbing particle. An acceptor material included in the acceptor is selected suitably depending on the infrared-absorbing material included in the infrared-absorbing particle. In the case where the infrared-absorbing material is copper sulfide, the acceptor may include cadmium sulfide. In the case where the infrared-absorbing material is tungsten oxide doped with cesium, the acceptor may include, for example, at least one selected from zinc oxide, titanium oxide, tin oxide, and gallium oxide. In the case where the infrared-absorbing material is ITO, the acceptor may include tin oxide. The acceptor may be included as a particle, or may be included so as to form a layer. The acceptor may be included in the same layer as that including the infrared-absorbing particle, or may be included in an adjacent layer. Also, the acceptor may be a conductive organic material; or graphene, carbon nanotube, graphite, and diamond-like carbon.

(Composite Particle)

Figure 9:
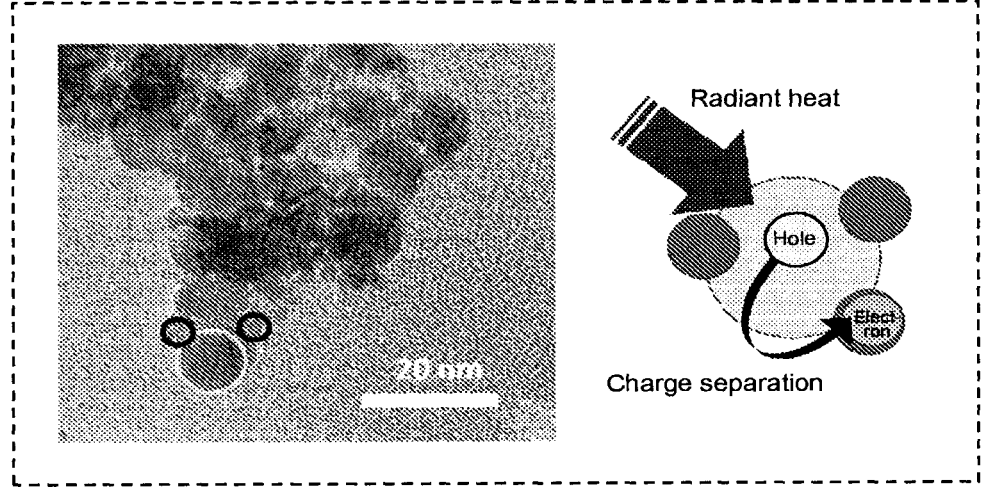
FIG. 9 shows an image (left) obtained by observing a composite particle composed of an infrared-absorbing particle and acceptors bonded to the infrared-absorbing particle, and a diagram (right) for explaining separation of charges generated in the composite particle in response to infrared ray irradiation.

The infrared-absorbing particle and the acceptor may form a composite particle by being bonded to and integrated with each other. FIG. 9 shows an example of the composite particle. This composite particle is a composite particle obtained by allowing tin oxide ($SnO_2$) particles to adhere to an ITO particle. The tin oxide particles may be bonded to the ITO particle physically or chemically. As shown in the right-side diagram in FIG. 9, as for a hole and an electron generated by an infrared ray (the "radiant heat" in the diagram), the electron moves to one of the $SnO_2$ particles that each are the acceptor and is separated from the hole that remains in the ITO particle. The charge separation by the use of the composite particle is advantageous in inhibiting the recombination and in releasing the charge carriers efficiently.

(Binder)

The blocking film may include a binder. The binder can import a desirable property such as flexibility. Also, the binder can import a desirable property to the film or the layers by being present between particles such as the infrared-absorbing particle.

The binder may include a functional group that can be bonded to the particles, and the functional group is, for example, at least one selected from the group consisting of fluorine (F), chlorine (CI), bromine (Br), iodine (I), cyanide (CN), thiocyanato (SCN), isothiocyanato (NCS), hydroxide (OH), mercapto (SH), carbonyl (CO), amino ($NR_3$), nitrosyl (NO), nitrito ($NO_2$), phosphane ($PR_3$), carbene ($R_2C$), and pyridine ($NC_5H_5$). The functional group may be an anionic functional group to be bonded to the nanoparticles as an anion, i.e., for example, $F^-$. Each R is independently any organic group or a hydrogen atom. As can be understood from the above-mentioned examples, the functional group that can be bonded to the particles may be other functional groups that can function as a ligand to a metal atom or an anion.

The binder may be an inorganic compound or an organic compound. The binder may be an ion including or formed of any of the functional groups described above as examples, or may be a salt formed of the ion and its counterion. The binder may be a compound having two or more of the above-mentioned functional groups, the compound being typified by hydrazine ($H_2NNH_2$), ethylenediamine ($H_2NCH_2CH_2NH_2$), 1,2-ethanedithiol ($HSCH_2CH_2SH$, EDT), mercaptopropionic acid ($HSCH_2CH_2COOH$), acetylacetonato ($H_3CCOCHCOCH_3$), and aminobenzonitrile ($NH_2C_6H_4CN$).

It is desirable that the binder includes a compound having a molecular weight of, for example, 280 or less, even 250 or less, preferably 200 or less, more preferably 100 or less, even more preferably 80 or less, and in some cases less than 65. The lower limit of the molecular weight is, for example, but not particularly limited to, 20 or more, or even 30 or more. The use of the binder having not too large a molecular weight is suitable for controlling distances between the nanoparticles to be narrow and controlling the electrical resistance, infrared-absorbing property, and the like of the variable resistor portion within appropriate ranges.

The amount of the binder may be adjusted as appropriate depending on the type of the binder. The amount of the binder may be, for example, 1% or more, even 2% or more, particularly 3% or more, in some cases 5% or more, and preferably 8% or more in a ratio of the mass of the binder to the sum of the amounts of the particles and the binder. The upper limit of the amount is not particularly limited, and is 30% or less, or even 20% or less.

The binder mentioned above is suitable for coordination or adhesion to the particles. The binder may be a material other than such an adhesive compound. Examples of such material include various types of resins, specifically, polyvinyl alcohol, polyvinyl acetal, polyvinylpyrrolidone, carboxymethyl cellulose, acrylic resin, polyvinyl acetate, polyethylene terephthalate, polystyrene, polyethylene, and the like. Besides, an organic solvent, an electrically conductive polymer, electrically conductive particles, a pH adjuster, a colorant, a thickener, a surfactant, and the like can be used depending on the necessity in film formation, the application, or the like.

The film or the layers including the infrared-absorbing particle and the binder can be formed by spraying, dipping, etc. of a heat blocking composition. When used, the binder may coordinate to the particles by ligand substitution. This liquid-phase film formation method is suitable for enhancing production efficiency and increasing the size of the device. This method also has good adaptability to the production of flexible devices using a flexible resin substrate. However, the heat blocking film and the layers constituting the heat blocking film may be formed by sputtering and other gaseous-phase film formation methods.

In addition, by undergoing a reforming treatment such as a laser treatment, the binder may be formed so that it can function as the acceptor.

(Heat Blocking Film)

As described above, the heat blocking film includes, for example, an infrared-absorbing particle that absorbs an infrared ray and generates an electron and a hole, and an acceptor that can receive the electron or the hole from the particle. The heat blocking film is i) provided with a charge generating layer including the particle and a charge receiving layer including the acceptor, and the charge generating layer and the charge receiving layer are in contact with each other, or ii) a single-layer film including the particle and the acceptor. As described above, the heat blocking film is formed as a single-layer film or multilayer film including the infrared-absorbing particle, the acceptor, and the binder. Moreover, ii) the single-layer film including the particle and the acceptor is formed as iia) a mixed film in which the particle and the acceptor are simply mixed, or iib) a film including the particle and the acceptor that are bonded to each other, more specifically, integrated by being bonded to each other chemically or physically.

The heat blocking film may have a light transmittance of 25% or more, even 30% or more, or particularly 50% or more at a wavelength of 700 nm.

(Heat Blocking Composition)

The heat blocking composition for forming the heat blocking film can be prepared as a single-liquid composition or a multiliquid composition depending on the configuration and material of the heat blocking film. The heat blocking composition includes, for example, an infrared-absorbing particle that absorbs an infrared ray and generates an electron and a hole, and an acceptor that can receive the electron or the hole from the particle. The heat blocking composition is iii) a composition that has a first composition including the particle and a second composition including the acceptor, or iv) a composition that includes the particle and the acceptor. In addition, iv) the composition including the particle and the acceptor is iva) a mixture obtained by simply mixing the particle and the acceptor, or ivb) a composition in which the particle and acceptor that are bonded to each other, more specifically, integrated by being bonded to each other chemically or physically. In any of the cases, the binder can also be prepared as another composition, that is, as a third composition, for example.

[Substrate]

The shape and material of the substrate are not limited as long as the substrate can support the blocking film. The blocking film may be light-transmissive or non-light-transmissive. The substrate that is light-transmissive may be a glass plate, a resin plate, or a resin film.

APPLICATION EXAMPLES

Application examples to actual products will be explained with reference to FIGS. 10 to 12. A multilayer glass shown in FIG. 10 includes a pair of glass plates 15 and 25 disposed spaced apart from each other. The heat blocking film 10 is formed on a surface, on the side of an intermediate layer 40, of the glass plate 15 that is one of the glass plates. The intermediate layer 40 is, for example, an air layer shielded from an outside. The intermediate layer 40 may be decompressed, or it may be a layer charged with an inert gas. The glass plates 15 and 25 each may be a resin plate.

Figure 11:
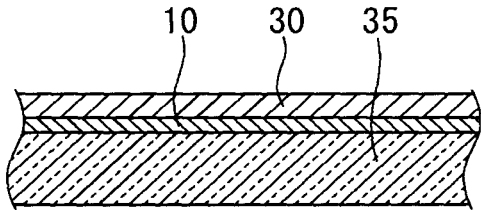
FIG. 11 is a diagram showing another application example of the device of the present invention.

A heat blocking sheet shown in FIG. 11 includes a light-transmissive resin sheet and the heat blocking film 10, and further includes an adhesive layer 30 covering the heat blocking film 10. The resin sheet 35 may be flexible. The adhesive layer 30 is formed in order to attach the heat blocking sheet to another substrate. FIG. 12 shows a state in which the adhesive layer 30 is attached to the glass plate 15. This application example is advantageous in that the heat blocking film can be fixed to a desired position easily.

Figure 10:
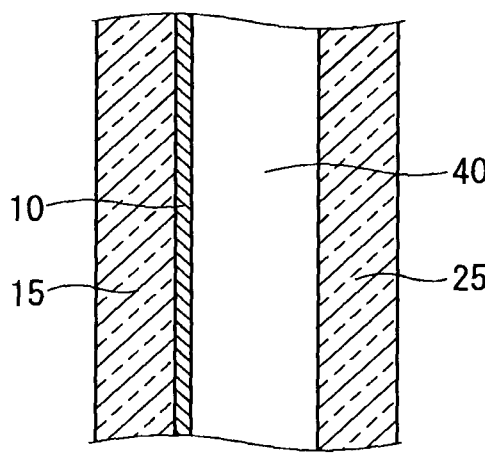
FIG. 10 is a diagram showing an application example of the device of the present invention.
Figure 12:
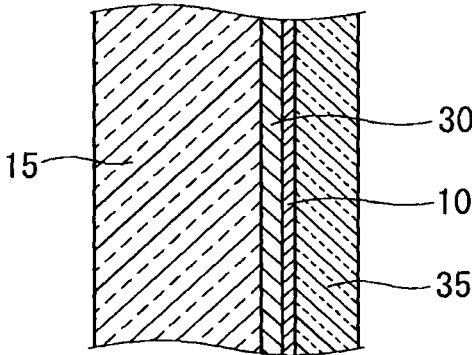
FIG. 12 is a diagram showing still another application example of the device of the present invention.

Although FIGS. 10 to 12 show examples in which a light-transmissive substrate is used, the present invention is also applicable to a non-light-transmissive substrate. Moreover, the position where the present invention is used is not limited to an opening at which a multilayer glass is disposed. For example, a partition around an industrial furnace that is heated to a high temperature of approximately 1000° C. or higher and releases a lot of infrared rays is one of the desirable positions for the above-mentioned heat blocking film to be disposed on. The heat blocking film may be formed on such a position that reaches a high temperature by applying the above-mentioned heat blocking composition thereonto.

Hereinafter, the present invention will be further described by way of examples. The following description is not intended to limit the present invention to specific examples, either.

Example 1

A tin oxide layer was formed, by using a sol-gel method, on an ITO substrate that was a glass plate on which an ITO layer had been formed in advance as a transparent electrode, and a CdS layer with a thickness of 500 nm was formed thereon by an RF spattering method.

Next, a solution for forming a charge generating layer including CuS nanoparticles was prepared. Into a three-neck flask A, 0.246 g of copper acetate and 20 ml of oleylamine were put, and evacuation was performed while performing stirring. Next, the flask A was heated using an oil bath to raise the liquid temperature to 160° C., and the flask A in this state was held for 1 hour. The rate of temperature rise was set to 8° C./min. 0.096 g of sulfur and 30 ml of 1-octadecene were put into another three-neck flask B, and evacuation and atmosphere substitution with a nitrogen gas were repeated while performing stirring. Then, the nitrogen gas was allowed to flow in to hold a nitrogen gas atmosphere. Next, the flask B was heated to raise the liquid temperature to 160° C. using an oil bath to dissolve sulfur. The rate of temperature rise was set to 5° C./min. After the flask B was left for 1 hour, a nitrogen gas was allowed to flow in to hold a nitrogen gas atmosphere.

The contents in the flask A were transferred to a centrifuge tube, and the contents in the flask B were put into the centrifuge tube using a syringe, and were held for 10 minutes. Then, after the heater was turned off and the liquid temperature lowered to 40° C., approximately 30 ml of hexane was put into the centrifuge tube. Next, after visual observation of dissolution of the resultant solid matter, 30 ml of ethanol was put, and a centrifugal operation was performed at the rotation speed of 2000 rpm for 5 minutes to collect a precipitate. Subsequently, the precipitate was dissolved in 5 ml of octane, and then 30 ml of ethanol was further put. A centrifugal operation was further performed at the rotation speed of 2000 rpm for 5 minutes to collect a precipitate. The mass of the precipitate was measured, and based on this, octane was added to 200 mg/ml to obtain a first ink where copper sulfide nanoparticles were dispersed.

The first ink included, together with the copper sulfide nanoparticles, oleylamine, which is a compound that can coordinate to the copper sulfide nanoparticles. As a result of analysis of the above-mentioned precipitate by thermogravimetric analysis (TGA), the ratio of the mass of oleylamine to the sum mass of the copper sulfide nanoparticles and oleylamine was 10%.

Then, onto the CdS layer, 50 μl of the first ink was applied using a spin coater to obtain a coating film. In the application, the concentration of the first ink was adjusted to 50 mg/ml.

Onto the coating film, 200 μl of a solution (a second ink) including EDT (ethylenedithiol) was applied using a spin coater thus to obtain a thin film that functions as a heat blocking film. The solvent for this solution was octane, and the concentration of the EDT (ethylenedithiol) was set to 0.3 mass %. At least a part of the oleylamine (a first compound) being the compound coordinating to the copper sulfide nanoparticles was substituted by the EDT (ethylenedithiol) (a second compound; a binder) by contact with the second ink.

On this coating film, an additional coating film was formed by the same film formation as the above using the first ink. Then, compound substitution was performed using the second ink in the same manner as the above. Thus, a charge generating layer having an increased thickness was obtained.

Subsequently, gold was vapor-deposited on a part of a surface of the charge generating layer thus to form a metal electrode. The metal electrode was formed to have a thickness of approximately 300 nm in an area of less than 5% of the surface of the charge generating layer. To each of the ITO (transparent electrode) and the metal electrode of the heat blocking device thus obtained, one conductive wire was fixed using a conductive adhesive, and further a resistor of 1 kΩ was connected between the two conductive wires thus to form an outside circuit.

There was conducted an experiment in which the heat blocking device was irradiated with an infrared ray in the state in which the heat blocking device was connected to the outside circuit. Light from an AM 1.5 mimic sunlight source (100 mW) was allowed to pass through a band pass filter so that the heat blocking device was irradiated only with light with a wavelength of 600 nm or more. A black body was placed at a position where the light having transmitted through the heat blocking device was to be absorbed, and the heat blocking device and the black body were measured for temperature change. The measurements of the temperature changes were made in the state in which the heat blocking device connected to the outside circuit was disposed, in the state in which the heat blocking device that was not connected to the outside circuit was disposed, and in the state in which the black body was directly irradiated with the light without the heat blocking device being disposed. Table 1 shows the temperature rises during 10 minutes from the start of the irradiation.

TABLE 1

(Example 1) CuS/CdS

| Object measured | Conditions | Temperature rise (° C.) |
|---|---|---|
| Black body | Heat blocking device connected to outside circuit | 1.5 |
| | Heat blocking device not connected to outside | 1.8 |
| | Heat blocking device was omitted | 3.7 |
| Device | Heat blocking device connected to outside circuit | 3.2 |
| | Heat blocking device not connected to outside | 4.8 |

It was ascertained that by releasing the charge from the heat blocking device to the outside, it is possible to block effectively the infrared ray flowing in as well as inhibit the temperature rise of the heat blocking device.

Example 2

A heat blocking device was produced in the same manner as that in Example 1 except that hydrazine was used instead of the EDT and at least a part of the oleylamine (the first compound) being the compound coordinating to the copper sulfide nanoparticles was substituted by the hydrazine (the second compound; a binder), and measurements were made under the same conditions as those in Example 1. Note that in Example 2, a measurement was also made in the state in which the heat blocking device was connected to the earth instead of the outside circuit. In this measurement, both of the ITO and the metal electrode were connected to the earth. Table 2 shows the results.

TABLE 2

(Example 2) CuS/CdS

| Object measured | Conditions | Temperature rise (° C.) |
|---|---|---|
| Black body | Heat blocking device connected to outside circuit | 1.2 |
| | Heat blocking device not connected to outside | 3.4 |
| | Heat blocking device was omitted | 3.7 |
| Device | Heat blocking device connected to outside circuit | 0.5 |
| | Heat blocking device not connected to outside | 3.5 |
| | Heat blocking device connected to earth | 0.9 |

Also in Example 2, it was ascertained that by releasing the charge from the heat blocking device to the outside, it is possible to block effectively the infrared ray flowing in as well as inhibit the temperature rise of the heat blocking device.

Example 3 Comparative Example 1

$Ga_2O_3$ nanoparticles were prepared by the same method as that in a previous report (J. AM. CHEM. SOC. 2010, 132, 9250-9252). An octane solution (50 mg/ml) of $Ga_2O_3$ nanoparticles was spin-coated on an FTO substrate that was a glass plate on which an FTO layer had been formed in advance as a transparent electrode, and washed with acetonitrile. This process was repeated twice, and then an octane solution (50 mg/ml) of CWO nanoparticles was spin-coated on the film of $Ga_2O_3$ nanoparticles and washed with acetonitrile. This process was repeated 5 times to form a laminate film of CWO nanoparticles and $Ga_2O_3$ nanoparticles. The laminate film thus obtained was heated at 450° C. in air for 30 minutes to remove ligands. The cured laminate film was cured at 450° C. under a reducing atmosphere (an argon atmosphere with a hydrogen content of 4%) for 2 hours to obtain a heat blocking device of Example 3. Also, a heat blocking device of Comparative Example 1 was obtained in the same manner as that in Example 3 except that the film of $Ga_2O_3$ nanoparticles was omitted.

The black body and the two heat blocking devices mentioned above were measured for temperature change in 5 minutes after the start of the irradiation in the same manner as that in Example 2. Note that only the connection to the earth was selected in Example 3, and measurements in which the heat blocking device was connected to the outside were omitted in Comparative Example 1. Table 3 shows the results. Note that the temperature rise is further inhibited by the connection to the outside circuit also in Example 3 as in Examples 1 and 2.

TABLE 3

(Example 3) CWO/Ga₂O₃; (Comparative Example 1) CWO

| | Object measured | Conditions | Temperature rise (° C.) |
|---|---|---|---|
| Example 3 | Black body | Heat blocking device connected to earth | 1.1 |
| | | Heat blocking device was omitted | 4.0 |
| | Device | Heat blocking device not connected to outside | 1.3 |
| | | Heat blocking device connected to earth | 1.2 |
| Comparative Example 1 | Black body | Heat blocking device was omitted | 4.0 |
| | Device | Heat blocking device not connected to outside | 1.6 |

Example 4 Comparative Example 2

Next, a solution for forming a charge generating layer including $Cu_7S_4$ nanoparticles was prepared. First, 1.891 g of copper acetate, 1.13 g of 1,3-dibutyl-2-thiourea, and 10 ml of oleylamine were put into a three-neck flask, and were subjected to nitrogen substitution while being stirred. Next, the liquid temperature was raised to 80° C. using a heating mantle, and was held for 1 hour. Then, at a stage when the liquid temperature lowered to 40° C., 40 ml of chloroform was gradually added to the three-neck flask to dissolve the solids.

The contents in the three-neck flask were transferred to a centrifuge tube, and after observation of a sufficient dissolution of the solid matter in the centrifuge tube, 40 ml of ethanol was put. Further, a centrifugal operation was performed under the conditions at 2000 rpm (rotation/minute) for 10 minutes, and a supernatant liquid was discarded immediately. Subsequently, the precipitate was dissolved in 5 ml of octane, and then 30 ml of ethanol was further put. A centrifugal operation was further performed at the rotation speed of 2000 rpm for 5 minutes to collect a precipitate. The mass of the precipitate was measured, and based on this, octane was added to 200 mg/ml to obtain a first ink in which copper sulfide nanoparticles were dispersed.

The first ink included, together with the copper sulfide nanoparticles, oleylamine, which is a compound that can coordinate to the copper sulfide nanoparticles. As a result of analysis of the above-mentioned precipitate by thermogravimetric analysis (TGA), the ratio of the mass of oleylamine to the sum mass of the copper sulfide nanoparticles and oleylamine was 10%.

As in Example 1, on a CdS layer formed on, by a high-frequency sputtering method using a CdS target, an ITO substrate on which zinc oxide had been laminated in advance, the first ink was spin-coated to form a coating film. Thereafter, onto the coating film, 200 µl of a solution (the second ink) including EDT (ethylenedithiol) was applied using a spin coater thus to obtain a thin film that functions as a heat blocking film. On this coating film, an additional coating film was formed by the same film formation as the above using the first ink. Then, compound substitution was performed using the second ink in the same manner as the above. Thus, a charge generating layer having an increased thickness was formed to obtain a heat blocking device of Example 4. In addition, a heat blocking device of Comparative Example 2 was obtained in the same manner as that in Example 4 except that the CdS layer was omitted.

The black body and the two heat blocking devices mentioned above were measured for temperature change in 5 minutes after the start of the irradiation in the same manner as that in Example 2. Note that measurements in which the heat blocking device was connected to the outside circuit were omitted in Example 4 and Comparative Example 2. Table 4 shows the results. Note that the temperature rise is further inhibited by the connection to the outside circuit also in Example 4 as in Example 1.

TABLE 4

| | | | Temperature rise (° C.) |
|---|---|---|---|
| | Object measured | Conditions | |
| Example 4 | Black body | Heat blocking device not connected to outside | 0.6 |
| | | Heat blocking device was omitted | 4.0 |
| | Device | Heat blocking device not connected to outside | 1.6 |
| Comparative Example 2 | Black body | Heat blocking device not connected to outside | 0.5 |
| | | Heat blocking device was omitted | 4.0 |
| | Device | Heat blocking device not connected to outside | 2.0 |

(Example 4) Cu₇S₄/CdS; (Comparative Example 2) Cu₇S₄

It was ascertained that the temperature rise of the device was inhibited more effectively in Examples 3 and 4 than in Comparative Examples 1 and 2 that include only the infrared-absorbing particles and include no acceptor.

Example 5

A heat blocking device was produced in the same manner as that in Example 4 except that hydrazine was used instead of the EDT, and measurements were made under the same conditions as those in Example 2. In Example 5, there were also made measurements in which the heat blocking device was connected to the outside circuit or to the earth. Table 5 shows the results.

TABLE 5

(Example 5) Cu₇S₄/CdS

| Object measured | Conditions | Temperature rise (° C.) |
|---|---|---|
| Black body | Heat blocking device connected to outside | 1.4 |
| | Heat blocking device not connected to outside | 1.6 |
| | Heat blocking device was omitted | 3.7 |
| Device | Heat blocking device connected to earth | 1.1 |
| | Heat blocking device connected to outside | 0.7 |
| | Heat blocking device not connected to outside | 1.5 |

Also in Example 5, it was ascertained that by releasing the charge from the heat blocking device to the outside, it is possible to block effectively the infrared ray flowing in as well as inhibit the temperature rise of the heat blocking device.

Example 6

A mixed solution of copper sulfide (CuS) nanoparticles dissolved in octane at a concentration of 100 mg/ml and CdS nanoparticles (a third ink) dissolved in octane at a concentration of 100 mg/ml was prepared. The third ink also included oleylamine as the first ink in Example 1 did.

As in Example 1, on a CdS layer formed on, by a high-frequency sputtering method using a CdS target, an ITO substrate on which zinc oxide had been laminated in advance, the third ink was spin-coated to form a coating film. Onto the coating film, 200 µl of a solution (a fourth ink) including hydrazine was applied using a spin coater thus to obtain a thin film that functions as an infrared response sensor. The solvent for this solution was octane, and the concentration of hydrazine was set to 0.3 mass %. At least a part of the oleylamine (a first compound) being the compound coordinating to the copper sulfide nanoparticles at the time of the synthesis of the nanoparticles was substituted by the hydrazine (a second compound; a binder) by contact with the hydrazine. Thereafter, a heat blocking device was produced in the same manner as in Example 1, and measurements were made in the same manner as in Example 1. In Example 6, there were also made measurements in which the heat blocking device was connected to the outside circuit or to the earth. Table 6 shows the results.

TABLE 6

(Example 6) CuS-CdS mixed film

| Object measured | Conditions | Temperature rise (° C.) |
|---|---|---|
| Black body | Heat blocking device connected to outside | 1.7 |
| | Heat blocking device not connected to outside | 3.3 |
| | Heat blocking device was omitted | 3.8 |
| Device | Heat blocking device connected to outside | 0.4 |
| | Heat blocking device not connected to outside | 3.7 |
| | Heat blocking device connected to earth | 2.8 |

Also in Example 6 in which a single-layer film including the infrared-absorbing particles and the acceptor particles was used, it was ascertained that by releasing the charge from the heat blocking device to the outside, it is possible to block effectively the infrared ray flowing in as well as inhibit the temperature rise of the heat blocking device.

Example 7

An ITO nanoparticle was synthesized by the same method as that in a previous report (Nano letters, 2019, 19, 11, 8149-8154). Subsequently, tin oxide was grown on a surface of the ITO nanoparticle using a seed mediated growth method thus to obtain a composite particle of ITO and tin oxide. The compositing was performed by allowing an $SnO_2$ layer to grow on the ITO nanoparticle that was a base material, referring to a method in a previous report (Materials Chemistry and Physics Volume 166, 15 Sep. 2015, Pages 87-94). Thereafter, by using the same method as the film formation method in Example 1 using the inks, an $ITO-SnO_2$ film was formed on a substrate by spin-coating, using hydrazine instead of the EDT as in Example 2. Thereafter, a heat blocking device was produced in the same manner as in Example 1, and measurements were made in the same manner as in Example 1. Table 7 shows the results.

TABLE 7

(Example 7) ITO/SnO₂ composite particle,
(Comparative Example 3) ITO particle

| Object measured | Conditions | Temperature rise (° C.) |
|---|---|---|
| Black body | ITO nanoparticle only | 3.0 |
| | ITO/SnO composite particle | 1.4 |
| | Heat blocking device was omitted | 5.7 |
| Device | ITO nanoparticle only | 5.0 |
| | ITO/SnO composite particle | 1.9 |

Example 8

Figure 13:
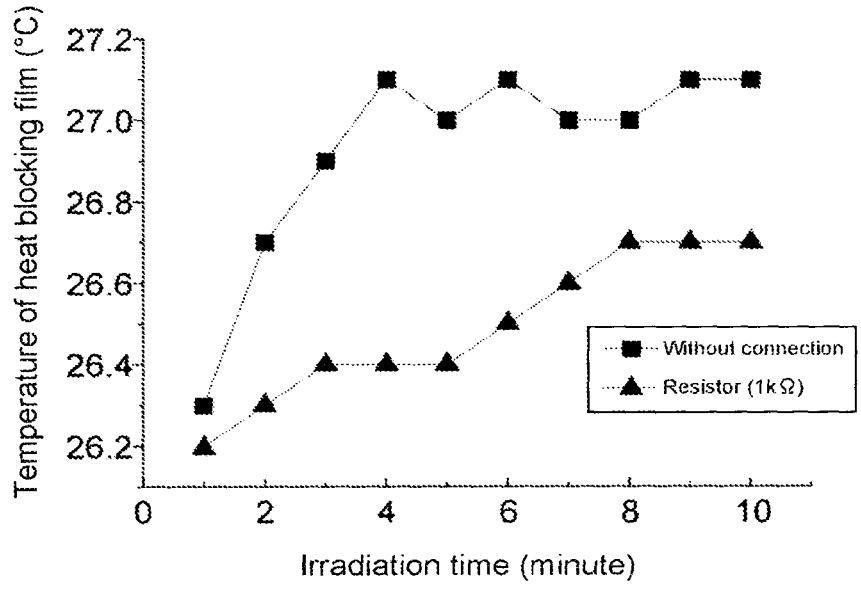
FIG. 13 is a graph showing examples of temperature change of the device of the present invention.

A heat blocking device obtained in the same manner as in Example 1 was examined for time-dependent temperature change when being irradiated with an infrared ray. Note that the distance from the filter to the heat blocking device was set longer than that in Example 1. Table 13 shows the results. In the case (referred to as "without connection" in FIG. 13) where the heat blocking device was not connected to the outside circuit, the temperature of the device became stable in approximately 4 minutes and the rise of the temperature was 0.7 to 0.8° C. In contrast, in the case where the device was connected to the outside circuit (with a resistor of 1 kΩ), the temperature of the device rose slowly. It took approximately 8 minutes for the temperature of the device to be stable, and also the rise of the temperature was only up to 0.5° C.

When the heat blocking film of each of the Examples was measured for light transmittance at a wavelength of 700 nm, it exceeded at least 24%. Specifically, the heat blocking film of Example 1 (8) had a light transmittance of 52% at a wavelength of 700 nm. As for the other Examples, the light transmittance of the heat blocking film at a wavelength of 700 nm was 50% in Example 2, 45% in Example 3, 25% in Example 4, 83% in Example 5, 50% in Example 6, and 90% in Example 7. Note that the heat blocking film of Example 1 (8) had a light transmittance of 67% at a wavelength of 600 nm. As for the other Examples, the light transmittance of the heat blocking film at a wavelength of 600 nm was 65% in Example 2, 57% in Example 3, 20% in Example 4, 82% in Example 5, 65% in Example 6, and 90% in Example 7, respectively.

Example 9

Figure 14:
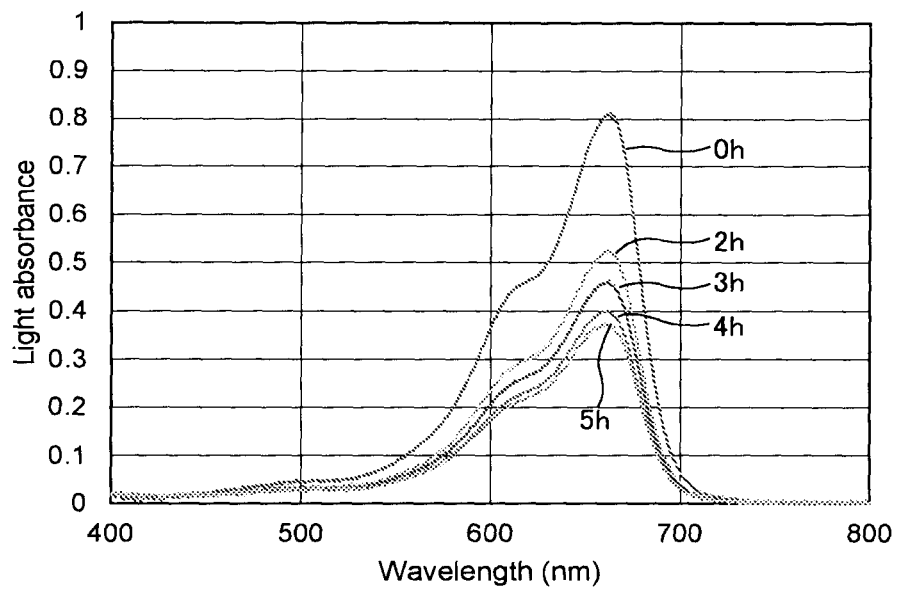
FIG. 14 is a graph showing examples of change in absorption spectrum intensity with the progress of a color fading reaction of methylene blue caused by charge carriers supplied from a heat blocking film.
Figure 15:
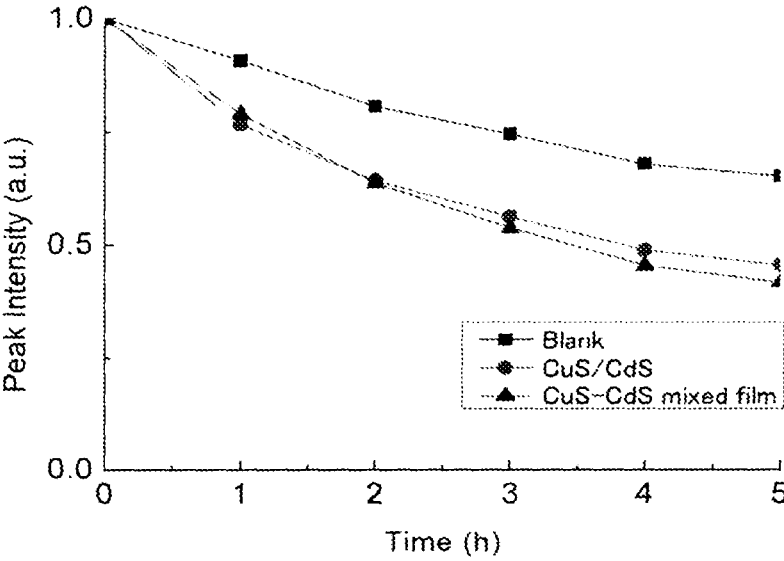
FIG. 15 is a graph showing the results of measurement of time-dependent change in light absorption peak intensity of methylene blue in the cases of using a heat blocking film that is a laminate film (CuS/CdS) and a heat blocking film that is a single-layer mixed film (CuS—CdS mixed film).

The degree of the progress of a color fading reaction of methylene blue caused by the charge carriers was evaluated on the blocking device of Example 2 including the CuS/CdS laminate blocking film and the blocking device of Example 6 including the CuS—CdS single-layer mixed film. This evaluation was made by irradiating the blocking device with an infrared ray in the state in which the blocking device was immersed in an aqueous solution of methylene blue contained in a cell and measuring the change in light absorbance by methylene blue. Note that this measurement was made without connecting the electrodes to the outside circuit. In the same manner as the above, light from an AM 1.5 mimic sunlight source (100 mW) was allowed to pass through a band pass filter so that the heat blocking device was irradiated only with light with a wavelength of 600 nm or more. FIG. 14 shows the time-dependent change, during up to five hours, in light absorption spectrum of the blocking device including the CuS—CdS single-layer mixed film. In addition, FIG. 15 shows the time-dependent change in light absorption peak intensity of both of the blocking devices. According to these FIGURES, it is considered that the holes generated in the blocking film by irradiation with the infrared ray generated active species such as a hydroxyl radical and thus the methylene blue was decomposed.

INDUSTRIAL APPLICABILITY

The device according to the present invention can be used in a wide range of fields as a heat blocking device, in other words, a "heat removing" device, that releases, as charge, a part of energy of the infrared ray having absorbed to the outside of the device. Charge is far easier than heat in terms of controlling the direction and amount of release. The present invention is useful to provide "heat removing" techniques for, for example, but not particularly limited to, placing a heat blocking device at openings of buildings and vehicles and around melting furnaces heated to high temperatures, and for mitigating the temperature rise of electronic devices.

The invention claimed is:

1. A heat blocking device that blocks at least a part of an infrared ray with which the heat blocking device is irradiated, comprising
   a heat blocking film including: a particle that absorbs the infrared ray and generates an electron and a hole; and an acceptor that receives the electron or the hole from the particle, wherein
   at least a part of charge carriers selected from the electron and the hole are released from the heat blocking film to an outside of the heat blocking device, and
   the heat blocking film has a light transmittance of 24% or more at a wavelength of 700 nm.

2. The heat blocking device according to claim 1, wherein the heat blocking film has a principal surface exposed to a gas or a liquid.

3. A heat blocking device that blocks at least a part of an infrared ray with which the heat blocking device is irradiated, comprising
   a heat blocking film including: a particle that absorbs the infrared ray and generates an electron and a hole; and an acceptor that receives the electron or the hole from the particle, and
   a non-light-transmissive electrode, wherein
   at least a part of charge carriers selected from the electron and the hole are released from the heat blocking film to an outside of the heat blocking device, and
   a region in which the electrode is formed is less than 50% of a light receiving region from which the infrared ray enters the device.

4. The heat blocking device according to claim 3, wherein the heat blocking film has a principal surface exposed to a gas or a liquid.

5. A heat blocking device that blocks at least a part of an infrared ray with which the heat blocking device is irradiated, comprising a heat blocking film including: a particle that absorbs the infrared ray and generates an electron and a hole; and an acceptor that receives the electron or the hole from the particle, wherein at least a part of charge carriers selected from the electron and the hole are released from the heat blocking film to an outside of the heat blocking device, and the heat blocking film is a single-layer film including the particle and the acceptor.

6. The heat blocking device according to claim 5, wherein the particle and the acceptor are bonded to each other.

7. A heat blocking device that blocks at least a part of an infrared ray with which the heat blocking device is irradi- ated, comprising a heat blocking film including: a particle that absorbs the infrared ray and generates an electron and a hole; and an acceptor that receives the electron or the hole from the particle, wherein at least a part of charge carriers selected from the electron and the hole are released from the heat blocking film to an outside of the heat blocking device, and the particle includes a material that can absorb an infrared ray by localized surface plasmon resonance.

8. The heat blocking device according to claim 7, wherein the particle is an inorganic particle.

* * * * *